United States Patent
Kang et al.

(10) Patent No.: US 7,183,574 B2
(45) Date of Patent: Feb. 27, 2007

(54) THIN FILM TRANSISTOR WITH GATE ELECTRODE PORTION CROSSING GRAIN GROWING DIRECTION AND LIQUID CRYSTAL DISPLAY COMPRISING THE SAME

(75) Inventors: Myung-Koo Kang, Seoul (KR); Hyun-Jae Kim, Seongnam (KR); Sook-Young Kang, Seoul (KR); Woo-Suk Chung, Anyang (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 10/500,514

(22) PCT Filed: Jan. 3, 2003

(86) PCT No.: PCT/KR03/00008

§ 371 (c)(1),
(2), (4) Date: Dec. 3, 2004

(87) PCT Pub. No.: WO03/060602

PCT Pub. Date: Jul. 24, 2003

(65) Prior Publication Data

US 2005/0083445 A1    Apr. 21, 2005

(30) Foreign Application Priority Data

Jan. 3, 2002    (KR) .................. 10-2002-0000179

(51) Int. Cl.
*H01L 21/00*    (2006.01)
(52) U.S. Cl. .................... 257/66; 257/21.134
(58) Field of Classification Search ................ 257/66, 257/E21.134
See application file for complete search history.

(56) References Cited

U.S. PATENT DOCUMENTS

| 5,633,738 | A | 5/1997 | Wakui et al. ................ 349/46 |
| 6,177,301 | B1* | 1/2001 | Jung ......................... 438/150 |
| 2001/0001745 | A1* | 5/2001 | Im et al. ..................... 438/747 |
| 2005/0230683 | A1* | 10/2005 | Yamaguchi et al. .......... 257/66 |

FOREIGN PATENT DOCUMENTS

| JP | 01124824 | 5/1989 |
| JP | 07321328 | 8/1995 |

* cited by examiner

*Primary Examiner*—Thomas L. Dickey
(74) *Attorney, Agent, or Firm*—F. Chau & Assoc., LLC

(57) ABSTRACT

The present invention relates to a thin film transistor and a liquid crystal display. A gate electrode is formed to include at least one portion extending in a direction perpendicular to a gain growing direction in order to make electrical charge mobility of TFTs uniform without increasing the size of the driving circuit. A thin film transistor according to the present invention includes a semiconductor pattern a thin film of poly-crystalline silicon containing grown grains on the insulating substrate. The semiconductor pattern includes a channel region and source and drain regions opposite with respect to the channel region. A gate insulating layer covers the semiconductor pattern. On the gate insulating layer, a gate electrode including at least one portion extending in a direction crossing the growing direction of the grains and overlapping the channel region is formed. In a liquid crystal display according to the present invention, a plurality of thin film transistors forming a data driver circuit include thin films of polycrystalline silicon formed by sequential lateral solidification, at least one portion of a gate electrode of each thin film transistor extends in a direction crossing the grain growing direction, and at least one of the plurality of thin film transistors has a gate electrode having a pattern different from other thin film transistors.

9 Claims, 3 Drawing Sheets

THIN FILM TRANSISTOR WITH GATE ELECTRODE PORTION CROSSING GRAIN GROWING DIRECTION AND LIQUID CRYSTAL DISPLAY COMPRISING THE SAME

BACKGROUND OF THE INVENTION (a) Field of the Invention

The present invention relates to a thin film transistor and a liquid crystal display.

(b) Description of Related Art

A liquid crystal display ("LCD") includes upper and lower panels provided with electrodes thereon and liquid crystal material interposed therebetween. The LCD displays an image by applying electric field to liquid crystal material interposed between the two panels using the electrodes and controlling the intensity of the electric field to adjust the transmittance of light passing through the panels.

The most popular one among those LCDs is the one that a common electrode and a plurality of pixel electrodes are formed on the respective panels, and a plurality of thin film transistors ("TFTs") switching the voltages applied to the pixel electrodes are formed on the panel with the pixel electrode.

The most conventional TFT used in an LCD is an amorphous silicon TFT using amorphous silicon as semiconductor pattern.

The amorphous silicon TFT has electrical charge mobility of about 0.5–1.0 cm2/V·sec, and, therefore, it can be used as a switching element of an LCD. However, it is not proper to use the amorphous silicon TFTs for a driving circuit directly on the liquid crystal panel due to its insufficient electrical charge mobility.

To overcome this problem, a polycrystalline silicon TFT using polycrystalline silicon having electrical charge mobility of about 20–150 cm2/V·sec as semiconductor pattern is developed. Since the polycrystalline silicon TFT has relatively high electrical charge mobility as described above, Chip In Glass structure in which driving circuits are embedded in the liquid crystal panel can be implemented.

Techniques for obtaining polycrystalline silicon thin film include as-deposition technique depositing polycrystalline silicon directly on a substrate at high temperature, a solid phase crystallization technique depositing amorphous silicon and crystallizing at high temperature, a technique depositing amorphous silicon and crystallizing by laser, and so forth. However, since those techniques require a high temperature process, it is not proper for application of glass substrates for LCDs. Also, they have a disadvantage that electrical characteristics are not uniform between TFTs due to non-uniform grain boundaries.

To resolve these problems, a sequential lateral solidification technique, which can artificially control distribution of a grain boundary, is suggested. This technique uses the fact that the grain of polycrystalline silicon grows in a direction perpendicular to the boundary plane between a liquid phase region exposed to laser beam and a solid phase region which was not exposed to laser beam.

In the sequential lateral solidification technique, a laser beam passes through a transmission area of a mask having a slit pattern to completely melt amorphous silicon to form liquid phase regions arranged in a shape of the slit pattern in the amorphous silicon layer. Then, the liquid phase amorphous silicon becomes cooled to be crystallized. At this time, a grain grows from the boundary of a solid phase region which was not exposed to laser in a direction perpendicular to the boundary plane, and the grains stop growing when they meet at the center of the liquid phase region. Such sequential lateral solidification can crystallize the whole thin film by moving the slit pattern of a mask along the growing direction of the grains.

However, if the sequential lateral solidification process is performed by moving the slit pattern of the mask only along the above grain growing direction, the grains grow to several microns in the above grain growing direction, but they grow just some thousands of Å in a direction perpendicular to the above grain growing direction.

If the size of grain has anisotropy, electrical characteristics of TFTs formed on a substrate also have anisotropy depending on the channel directions. That is, electrical charge mobility has a large variation between directions parallel and perpendicular to the above grain growing direction, and this causes a design difficulty that all TFTs should be arranged in the same direction when TFTs are formed on the liquid crystal panel.

Generally, a data driver circuit and a gate driver circuit incorporated in a liquid crystal panel are arranged to be perpendicular to each other, and, even for data driver circuits, TFTs arranged in both transverse and longitudinal directions are required as the circuit becomes complicated. In this case, the above-described sequential lateral solidification may have a big disadvantage.

Therefore, if an amorphous silicon thin film is crystallized by the sequential lateral solidification technique such that anisotropy of crystallization characteristic is caused, driving circuit design becomes difficult and the size of the driving circuit becomes large due to the complicated wiring.

SUMMARY OF THE INVENTION

The present invention is to make electrical charge mobility of TFTs uniform without increasing the size of a driving circuit in an LCD.

To achieve the above object, a gate electrode is formed such that at least one portion of the gate electrode extends in a direction perpendicular to a grain growing direction.

Specifically, a thin film transistor according to the present invention includes a semiconductor pattern including a thin film of poly-crystalline silicon containing grown grains on an insulating substrate. The semiconductor pattern includes a channel region and source and drain regions opposite with respect to the channel region. A gate insulating layer covers the semiconductor pattern. On the gate insulating layer, a gate electrode including at least one portion extending in a direction crossing the growing direction of the grains are formed to overlap the channel region.

Here, the at least one portion of the gate electrode may cross the growing direction of the grain at right angle. The gate electrode may include a first portion extending in a direction parallel to the growing direction of the grains and second and third portions connected to respective ends of the first portion and extending in a direction perpendicular to the growing direction of the grains. Alternatively, the gate electrode includes a first portion extending in a direction perpendicular to the growing direction of the grains and second and third portions connected to respective ends of the first portion and extending in a direction parallel to the growing direction of the grains.

A liquid crystal display according to the present invention includes a display area defined on the insulating substrate for displaying picture, a data driver circuit for transmitting data signals to the display area, and a gate driver circuit for transmitting gate signals to the display area. Here, the data driver circuit includes a plurality of thin film transistors including a thin film of polycrystalline silicon formed by sequential lateral solidification. Each thin film transistor includes a gate electrode including at least one portion extending in a direction crossing the growing direction of grains. The gate electrode of at least one of the plurality of thin film transistors has a pattern different from other thin film transistors. It is preferable that the gate driver circuit includes a plurality of thin film transistors including a thin film of polycrystalline silicon formed by sequential lateral solidification, each thin film transistor includes a gate electrode including at least one portion extending in a direction crossing the growing direction of grains, and the gate electrode of at least one of the plurality of thin film transistors has a pattern different from other thin film transistors.

DETAILED DESCRIPTION OF THE PREFERRED EMBODIMENTS

Now, the present invention is described in detail with reference to accompanying drawings.

First, a technique of crystallization of an amorphous silicon thin film using sequential lateral solidification is described.

Figure 1:
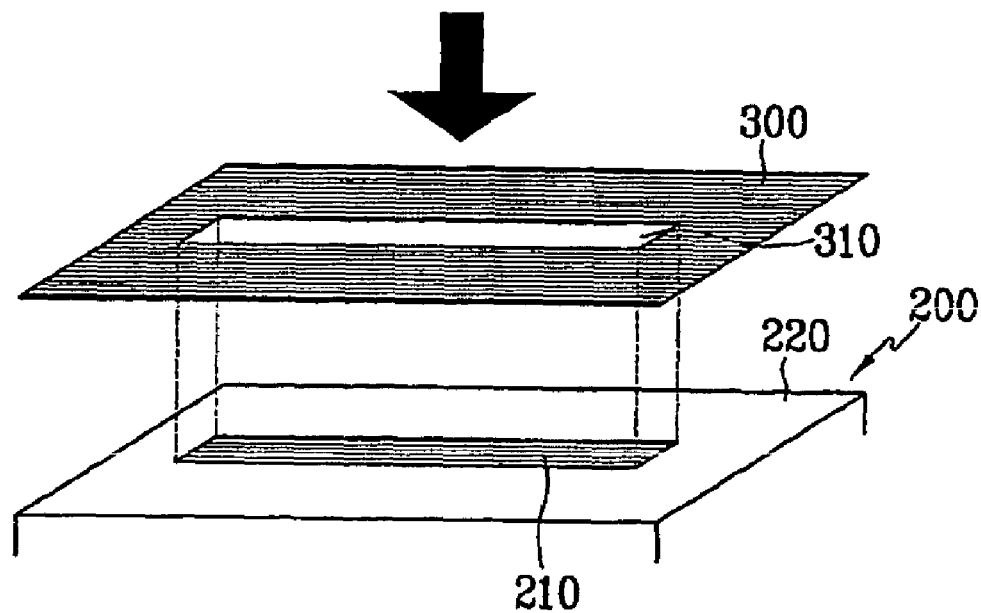
FIG. 1 is a schematic diagram showing a sequential lateral solidification process.
Figure 2:
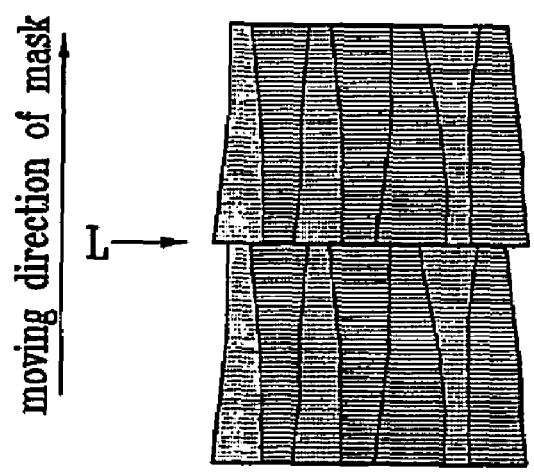
FIG. 2 schematically shows a detailed structure of a grain in a polycrystalline silicon thin film formed by a sequential lateral solidification.

FIG. 1 is a schematic diagram showing a sequential lateral solidification process, and FIG. 2 schematically shows a detailed structure of a polycrystalline silicon thin film during crystallization from amorphous silicon to polycrystalline silicon in the sequential lateral solidification process.

As shown in FIG. 1, according to the sequential lateral solidification process, a laser beam is applied to a plurality of local regions of an amorphous silicon layer 200 formed on an insulating substrate using a mask 300 having a transmission area 310 with a slit pattern to completely melt the amorphous silicon in the local regions such that a plurality of liquid phase regions are formed in an area of the amorphous silicon layer 200 corresponding to the transmission area 310.

At this time, a grain of polycrystalline silicon grows from a boundary surface between the liquid phase region 210 exposed to the laser beam and a solid phase region 220 where the laser beam is not applied along a direction perpendicular to the boundary surface. The grains stop growing when they meet at the center of the liquid phase region. They are grown to a desired degree by applying a laser beam while moving the slit pattern of the mask 300 along the growing direction of the grains to continue the lateral growth of the grains. Therefore, the size of the grain can be controlled.

FIG. 2 shows a grain structure of polycrystalline silicon formed by the sequential lateral solidification process using a mask provided with a slit pattern elongated in a transverse direction.

It can be known that grains are grown in a direction perpendicular to the slit pattern. It can be also known that the polycrystalline silicon thin film shown in FIG. 2 is formed by the sequential lateral solidification process using two slit patterns.

"L" is a boundary where two adjacent polycrystalline silicon regions meet when the, polycrystalline silicon regions are formed by performing the sequential lateral solidification using respective slit patterns.

However, if the sequential lateral solidification process is performed while moving the slit pattern of the mask only along the grain growing direction, grains of several microns are obtained in the grain growing direction, but small grains of some thousands Å are formed in a direction perpendicular to the grain growing direction.

If a gate electrode runs across a semiconductor layer of a thin film transistor along a direction perpendicular to the grain growing direction, the direction of a channel formed in the semiconductor layer of the TFT is parallel to the growing direction and thus the electron mobility passing through the channel is high. On the contrary, if a gate electrode runs parallel to the grain growing direction, the channel direction is perpendicular to the grain growing direction and thus the electron mobility passing through the channel is low. The difference in the electron mobility is generated since electrons moving in the channel move within the grains without directly passing through the grain boundary.

The electron mobility of the TFT has a large variation depending on the running direction of the gate electrode across the semiconductor layer, and characteristics of the TFTs formed on the liquid crystal panel become very irregular depending on their positions. To solve these problems, at least a portion of the gate electrode of the TFT according to an embodiment of the present invention extends in a direction crossing the grain growing direction.

Then, TFTs according to embodiments of the present invention, which are provided with polycrystalline silicon thin films formed by the sequential lateral solidification, will be described.

Figure 3A:
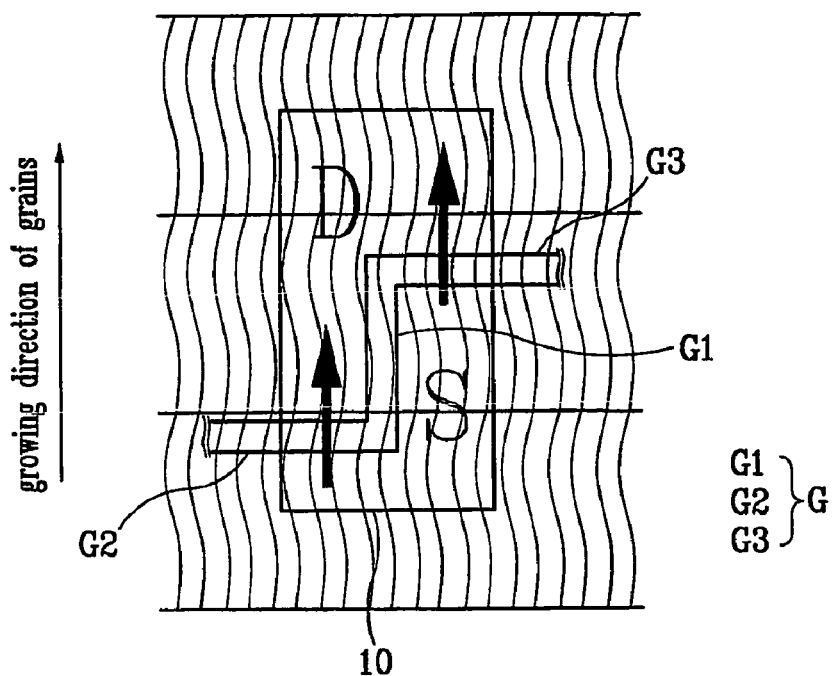
FIGS. 3A and 3B show schematic structures of TFTs according to first and second embodiments of the present invention.

FIG. 3A is a layout view showing a designed arrangement of a semiconductor pattern and a gate electrode of a TFT according to a first embodiment of the present invention.

In the TFT according to this embodiment, a semiconductor pattern 10 has a rectangular shape with a length parallel to a grain growing direction.

A gate electrode G formed at the semiconductor pattern 10 is designed such that portions of the gate electrode G extend perpendicular to the grain growing direction and thus electrons passing through a region of a channel of the semiconductor pattern 10 corresponding to this portion move along the grain boundary without running into the grain boundary.

In this embodiment, the gate electrode G includes a first portion G1 extending parallel to the grain growing direction, and second and third portions G2 and G3 connected to respective ends of the first portion G1 and extending perpendicular to the grain growing direction. The semiconductor pattern 10 includes a source region S and a drain region D doped with conductive impurities located opposite with respect to the gate electrode G.

When a gate-on voltage is applied to the gate electrode G, a channel where electrons can move is formed in a portion of the semiconductor pattern 10 under the gate electrode G. When a data voltage is applied to the source region S under this condition, electrical charge in the source region S moves to the drain region D through the channel. At this time, the electrical charges pass straight through portions of the channel formed by the second and the third portions G2 and G3 of the gate electrode G along paths having no grain boundary, and thus the mobility becomes high. Arrows in the figures indicate the movement of electrical charge.

Figure 3B:
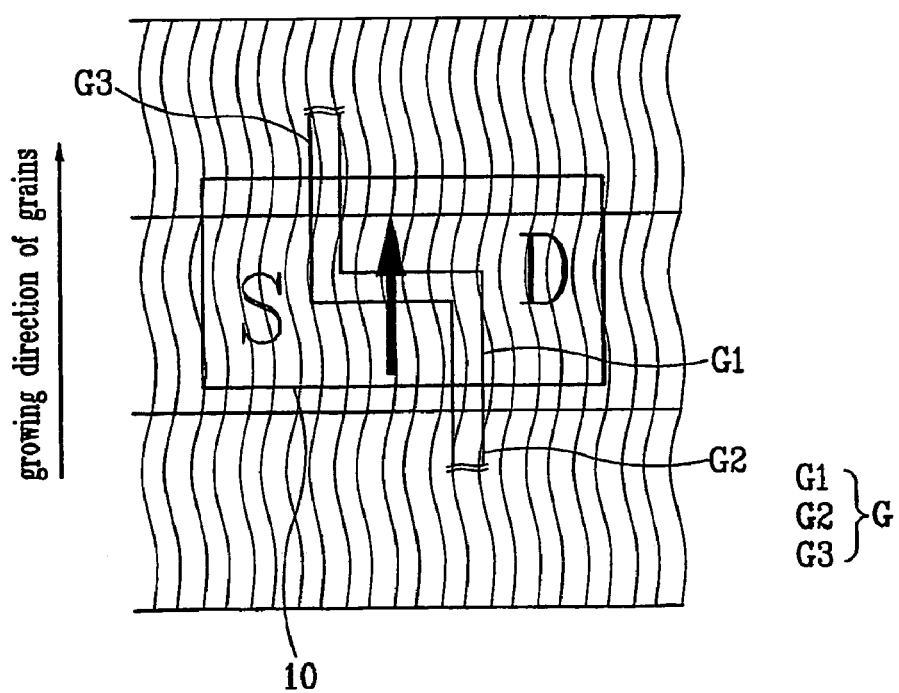

FIG. 3B is a layout view schematically showing the structures of a semiconductor pattern and a gate electrode of a TFT according to a second embodiment of the present invention.

In the TFT according to this embodiment, a semiconductor pattern 10 has a rectangular shape with a length perpendicular to a growing direction of grains.

A gate electrode G formed at the semiconductor pattern 10 is designed such that a portion of the gate electrode G extends perpendicular to the grain growing direction and thus electrons passing through a region of a channel of the semiconductor pattern 10 corresponding to this portion move without running into the grain boundary.

In this embodiment, the gate electrode G includes a first portion G1 extending perpendicular to the grain growing direction, and second and third portions G2 and G3 connected to respective ends of the first portion G1 and extending parallel to the grain growing direction. The semiconductor pattern 10 includes a source region S and a drain region D doped with conductive impurities located opposite with respect to the gate electrode G.

When a gate-on voltage is applied to the gate electrode G, a channel where electrons can move is formed in a portion of the semiconductor pattern 10 under the gate electrode G. When a data voltage is applied to the source region S under this condition, electrical charge in the source region S moves to the drain region D through the channel. At this time, the electrical charges pass straight through portions of the channel overlapping the first portion G1 of the gate electrode G along paths having no grain boundary, and thus the mobility becomes high. Arrows in the figures indicate the movement of electrical charge.

Although the above-described exemplary TFTs according to the first and second embodiments of the present invention includes the gate electrodes including a portion extending perpendicular to the grain growing direction, the electron mobility may become higher if there is no grain boundary which obstructs the movement of the electrons in the channel. Therefore, a TFT according to the present invention is formed such that a portion of the gate electrode G extends in a direction crossing the grain growing direction and thus a region of the channel formed by that portion has no grain boundary.

As described above, by improving the structure of a gate electrode such that at least a portion of the gate electrode extends in a direction crossing the grain growing direction, the electrons can move swiftly through the channel of the semiconductor pattern formed thereunder.

In general, since electrical characteristics of a TFT are determined by highest electrical charge mobility, TFTs having gate electrodes including at least a portion extending in a direction crossing the grain growing direction according to the present invention have relatively uniform electrical charge mobility regardless of the shape of the gate electrodes and semiconductor patterns. In addition, TFTs having intended electrical characteristics can be obtained by adjusting the widths and the lengths of the gate electrodes, which determines the electrical characteristics of the TFTs.

Current characteristic of a P-type TFT designed according to the embodiments of the present invention was measured.

A TFT was designed such that its gate electrode extends parallel to a grain growing direction and includes at least a portion crossing the grain growing direction at right angle according to the first and second embodiments of the current invention. Thereafter, the current mobility of the TFT was measured, and measured current mobility is improved by equal to or more than 30% compared with a TFT having a gate electrode entirely extending parallel to the grain growing direction.

Figure 4:
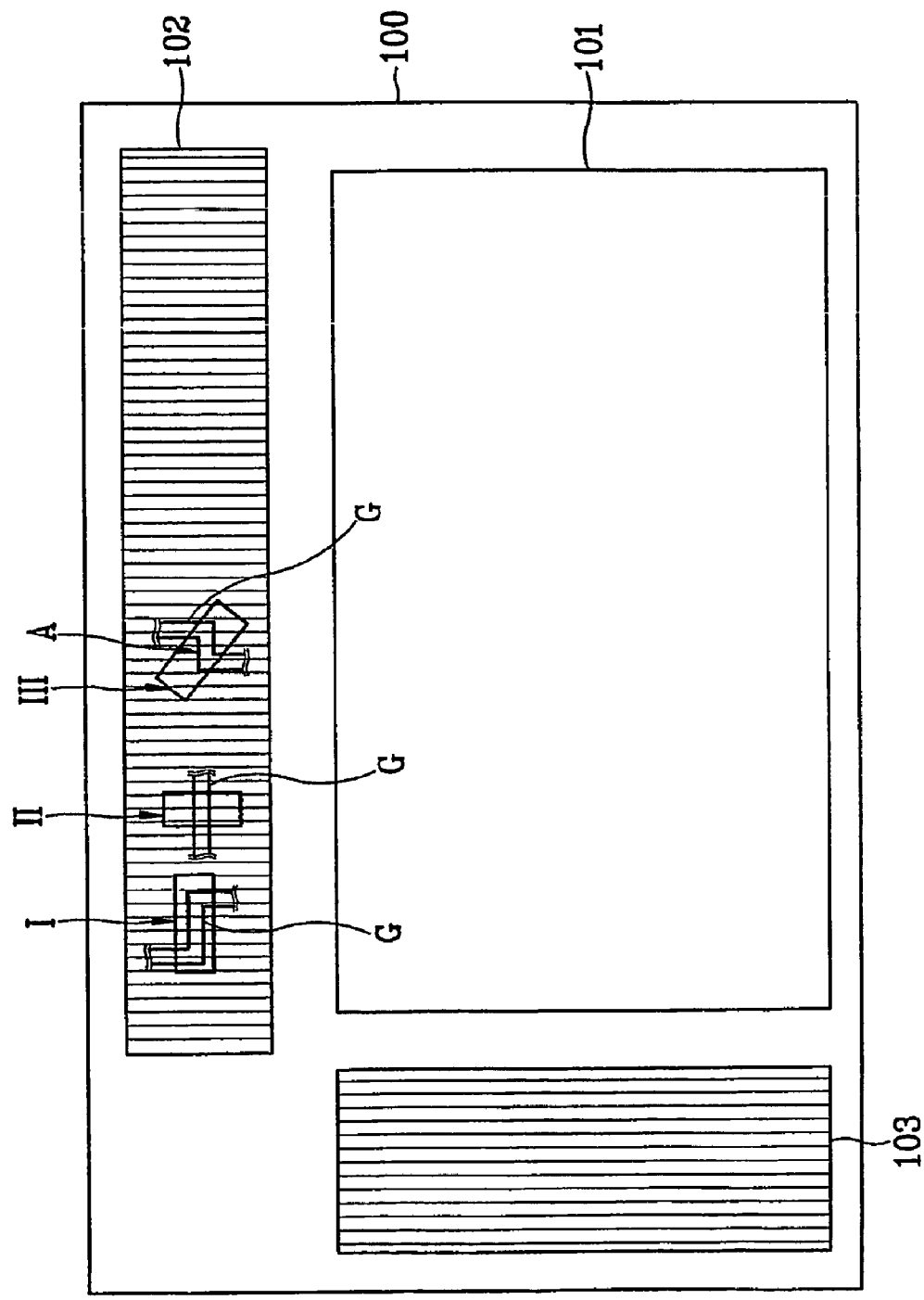
FIG. 4 is a schematic diagram of an LCD according to an embodiment of the present invention.

FIG. 4 is a schematic diagram of an LCD according to an embodiment of the present invention, which shows an arrangement of TFTs in a gate driver circuit and a data driver circuit.

The LCD includes a display area 101 having a plurality of pixels arranged in a matrix on an insulating substrate 100 for displaying image and a data driver circuit 102 and a gate driver circuit 103 for applying data signals and gate signals to the display area 101, respectively. Here, semiconductor patterns I, II and III of TFTs formed in the display area 101, the data driver circuit 102, and the gate driver circuit 103 include polycrystalline silicon thin films formed on the insulating substrate 100 by the sequential lateral solidification.

The semiconductor patterns I, II and III of each driving circuit 102 or 103 have different shapes depending on available areas or wiring design.

As shown in the figure, the semiconductor patterns I and II of the first and the second TFTs of the data driver circuit 102 are rectangular and extend perpendicular or parallel to the grain growing direction as in the first and the second embodiments of the present invention. The semiconductor pattern III of a third TFT is formed oblique to the grain growing direction, but its gate electrode G is patterned such that at least one portion part of the gate electrode, i.e., a portion denoted as "A" crosses the grain growing direction, for example, at right angle to enhance the electrical charge mobility. The semiconductor patterns I, II, and III of the first, second and third TFTs in the data driver circuit 102 are mere examples, and they can be formed to have various patterns and shapes. Here, at least one of a plurality of TFTs forming the data driver circuit 102 may have a gate electrode having a pattern different from the other TFTs.

Furthermore, a plurality of TFTs (not shown) in the gate driver circuit 103 may also have various shapes as described for the data driver circuit 102.

Since the TFTs in the display area 101 do not need high electrical charge mobility, silicon thin films used as semiconductor patterns can be selected from amorphous silicon, polycrystalline silicon formed by a conventional crystallization technique such as high temperature crystallization or laser crystallization, and polycrystalline silicon formed by sequential lateral solidification. At this time, it is preferable that a plurality of TFTs in the display area 101 have the same condition to ensure uniform electrical characteristic in the display area 101.

TFTs according to an embodiment of the present invention is manufactured by a conventional TFT manufacturing method, and a polycrystalline silicon thin film to form a semiconductor pattern may be formed using the sequential lateral solidification in the same way.

In the present invention, the shape of the gate electrode is not confined to the suggested embodiment, and the gate electrode can rather have various shapes regardless of the shape of the semiconductor pattern as long as a portion of the gate electrode extends in a direction crossing the grain growing direction.

TFTs used to form elements of the gate driver circuit or data driver circuit of an LCD may include semiconductor patterns having proper shapes depending on the position.

Also, the directions of the channels can be controlled in this case, thereby removing wiring complexity.

According to the present invention, a TFT having high electrical charge mobility and uniformity of electrical charge mobility between TFTs can be obtained without enlarging the size of the driving circuit

What is claimed is:

1. A thin film transistor comprising:
   an insulating substrate;
   a semiconductor pattern including a thin film of polycrystalline silicon containing grown grains on the insulating substrate, the semiconductor pattern including a channel region and source and drain regions opposite with respect to the channel region;
   a gate insulating layer formed on the semiconductor pattern; and
   a gate electrode formed on the gate insulating layer overlapping the channel region and including a first portion and a second portion connected to one end of the first portion, wherein
   the first portion and the second portion overlap with the channel region,
   the first portion extends in a direction crossing a growing direction of the grains, and
   the second portion extends in a direction substantially perpendicular to the first portion.

2. The thin film transistor of claim 1, wherein the first portion crosses the growing direction of the grain substantially at a right angle.

3. The thin film transistor of claim 2, wherein the gate electrode further comprises a third portion connected to one end of the second portion and extending in a direction crossing the growing direction of the grains.

4. The thin film transistor of claim 2, wherein the gate electrode further comprises a third portion connected to another end of the first portion and extending in a direction substantially perpendicular to the first portion.

5. A liquid crystal display comprising:
   an insulating substrate;
   a display area defined on the insulating substrate for displaying an image;
   a data driver circuit defined on the insulating substrate for transmitting data signals to the display area; and
   a gate driver circuit defined on the insulating substrate for transmitting gate signals to the display area
   wherein the data driver circuit includes a plurality of thin film transistors, each of the plurality of thin film transistors includes a thin film of polycrystalline silicon formed by sequential lateral solidification, a channel region and source and drain regions opposite with respect to the channel region, and a gate electrode having a first portion extending in a direction crossing a growing direction of grains of the polycrystalline silicon and a second portion connected to one end of the first portion and extending in a direction substantially perpendicular to the first portion, wherein the first portion and the second portion overlap with the channel region, and the gate electrode of at least one of the plurality of thin film transistors has a pattern different from other thin film transistors.

6. The liquid crystal display of claim 5, wherein the gate driver circuit comprises a plurality of thin film transistors, each of the plurality of thin film transistors includes a thin film of polycrystalline silicon formed by sequential lateral solidification and a gate electrode having at least one portion extending in a direction crossing the growing direction of grains, and at least one of the plurality of thin film transistors has a gate electrode having a pattern different from other thin film transistors.

7. The liquid crystal display of claim 5, wherein the first portion crosses the growing direction of the grains substantially at a right angle.

8. The liquid crystal display of claim 5, wherein the gate electrode further comprises a third portion connected to one end of the second portion and extending in a direction crossing the growth direction of the grains.

9. The liquid crystal display of claim 5, wherein the gate electrode further comprises a third portion connected to another one end of the first portion and extending in a direction substantially perpendicular to the first portion.

* * * * *